United States Patent [19]

Ogata

[11] Patent Number: 5,247,266

[45] Date of Patent: Sep. 21, 1993

[54] OSCILLATION INDUCING CICUIT

[75] Inventor: Yukihisa Ogata, Tokyo, Japan

[73] Assignee: NEC Corporation, Japan

[21] Appl. No.: 890,616

[22] Filed: May 28, 1992

[30] Foreign Application Priority Data

May 29, 1991 [JP] Japan .................. 3-124245

[51] Int. Cl.$^5$ .................. H03B 5/04; H03B 5/06; H03B 5/36

[52] U.S. Cl. .................. 331/185; 331/108 C; 331/116 FE; 331/173

[58] Field of Search .......... 331/108 A, 108 C, 116 R, 331/116 FE, 117 R, 117 FE, 117 D, 158, 172, 173, 185

[56] References Cited

U.S. PATENT DOCUMENTS 4,232,261 11/1980 Lingstaedt et al. ............. 331/186 X
4,365,212 12/1982 Gentile et al. .................. 331/172 X Primary Examiner—David Mis
Attorney, Agent, or Firm—Laff, Whitesel, Conte & Saret

[57] ABSTRACT

An oscillation inducing circuit includes a power-on circuit connected to a power supply of $V_{DD}$, a plurality of transfer gates, and a capacitor. The power-on circuit (1) supplies a control signal having a first level to the transfer gates so that a capacitor is charged in a first polarity direction to an instantaneous level of the increasing power supply voltage, and (2) supplies a control signal having a second level so that the capacitor is charged in a second polarity direction, opposite to the first direction, to a voltage equal to an addition of the previously charged voltage and the present instantaneous power supply voltage. Together, these two charges produce a relatively high voltage for initializing the circuit and starting an oscillator.

4 Claims, 7 Drawing Sheets

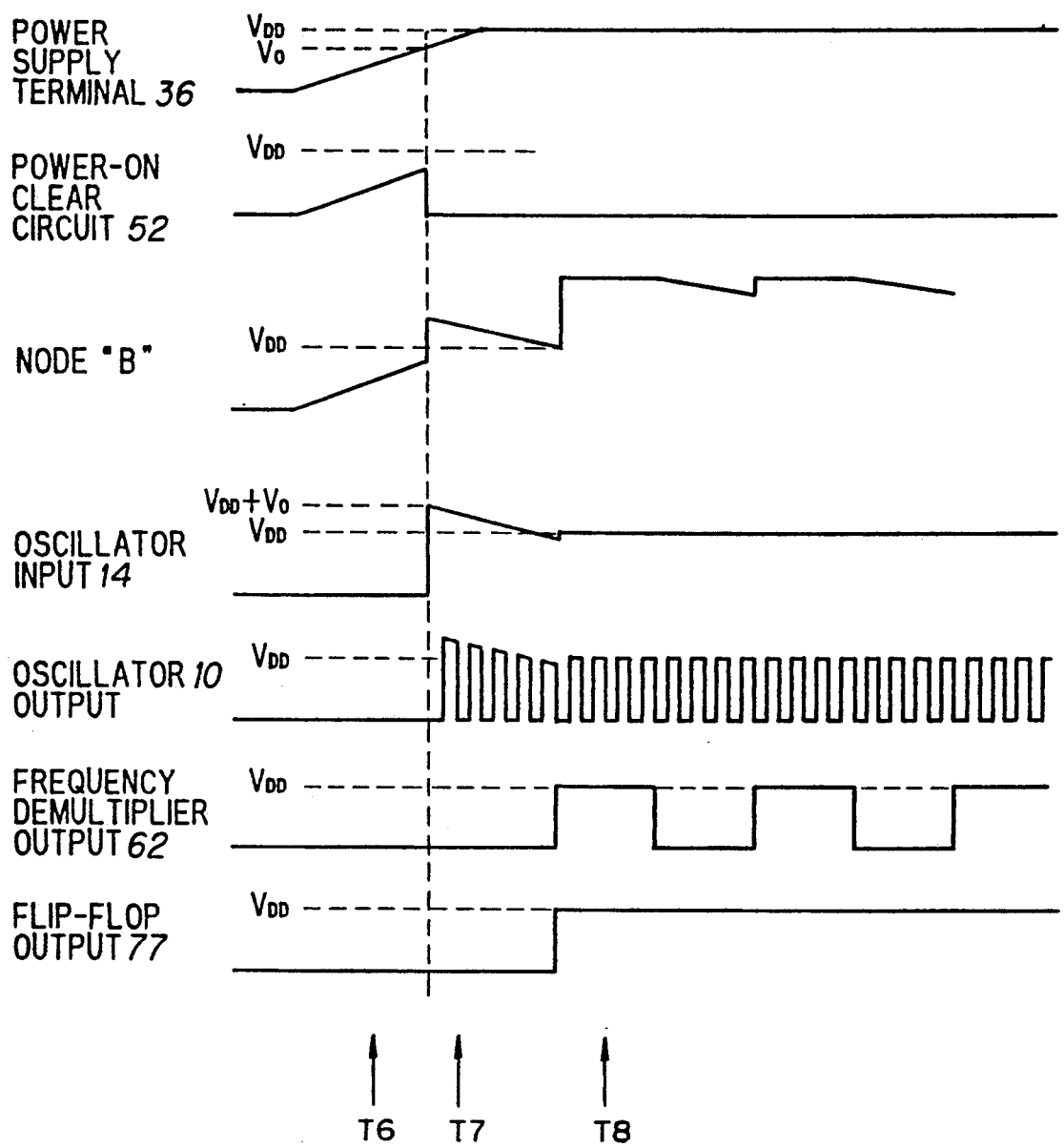

OSCILLATION INDUCING CICUIT

FIELD OF THE INVENTION

This invention relates to an oscillation inducing circuit, and more particularly to, an oscillation inducing circuit for an oscillator used in a semiconductor integrated circuit operated at a low level voltage.

BACKGROUND OF THE INVENTION

Recently, a semiconductor IC (integrated circuit) has been operated at a low level voltage. In this situation, there is a problem because the low level voltage is not sufficient for an oscillator provided in the semiconductor IC, especially at the start of oscillation, so that the oscillation can not be started. Accordingly, an oscillation inducing circuit is used in the semiconductor IC to obtain a boosted voltage supplied to the oscillator.

A conventional oscillation inducing circuit comprises a plurality of transfer gates which are turned on and off in response to received clock signals. A capacitor accumulates electric charges from a power supply in accordance with the turning-on and off of the transfer gates.

In operation, the capacitor is charged by a voltage of the power supply applied alternately on two opposite electrodes, when the transfer gates are turned on and off synchronously with the clock signals, so that a boosted voltage which is larger than the power supply voltage is obtained at one of the two opposite electrodes of the capacitor. The boosted voltage is applied to an oscillator which is driven to provide a predetermined oscillation signal.

However, the conventional oscillation inducing circuit has a disadvantage in that an operation can not be carried out, unless clock signals are available thereto. Therefore, an oscillator is absolutely required to have been operating at the starting time of the operation of the conventional oscillation inducing circuit.

SUMMARY OF THE INVENTION

Accordingly, it is an object of the invention to provide an oscillation inducing circuit which can operates without using a clock pulse.

According to the invention, an oscillation inducing circuit, including:

a power-on clear circuit for initializing an integrated circuit by turning a power supply on;

a capacitor having first and second electrodes, the capacitor being charged from the power supply to be a predetermined voltage which is higher than a voltage of the power supply; and a plurality of transfer gates to be switched on and off dependent on a signal state of the power-on clear circuit;

wherein the capacitor is charged to be a voltage equal to the voltage of the power supply in a polarity direction of the first to second electrodes in accordance with a first state of switching on and off of the transfer gates by the power supply; and the capacitor is further charged to be the predetermined voltage in an opposite polarity in accordance with a second state of switching on and off of the transfer gates by the power supply.

BRIEF DESCRIPTION OF THE DRAWINGS

The invention will be explained in more detail in conjunction with appended drawings; wherein:

FIG. 7 is a timing chart showing operation of the second preferred embodiment.

DESCRIPTION OF THE PREFERRED EMBODIMENTS

Before describing an oscillation inducing circuit according to the invention, the briefly aforementioned conventional oscillation inducing circuit will be explained in conjunction with FIGS. 1 to 3.

Figure 1:
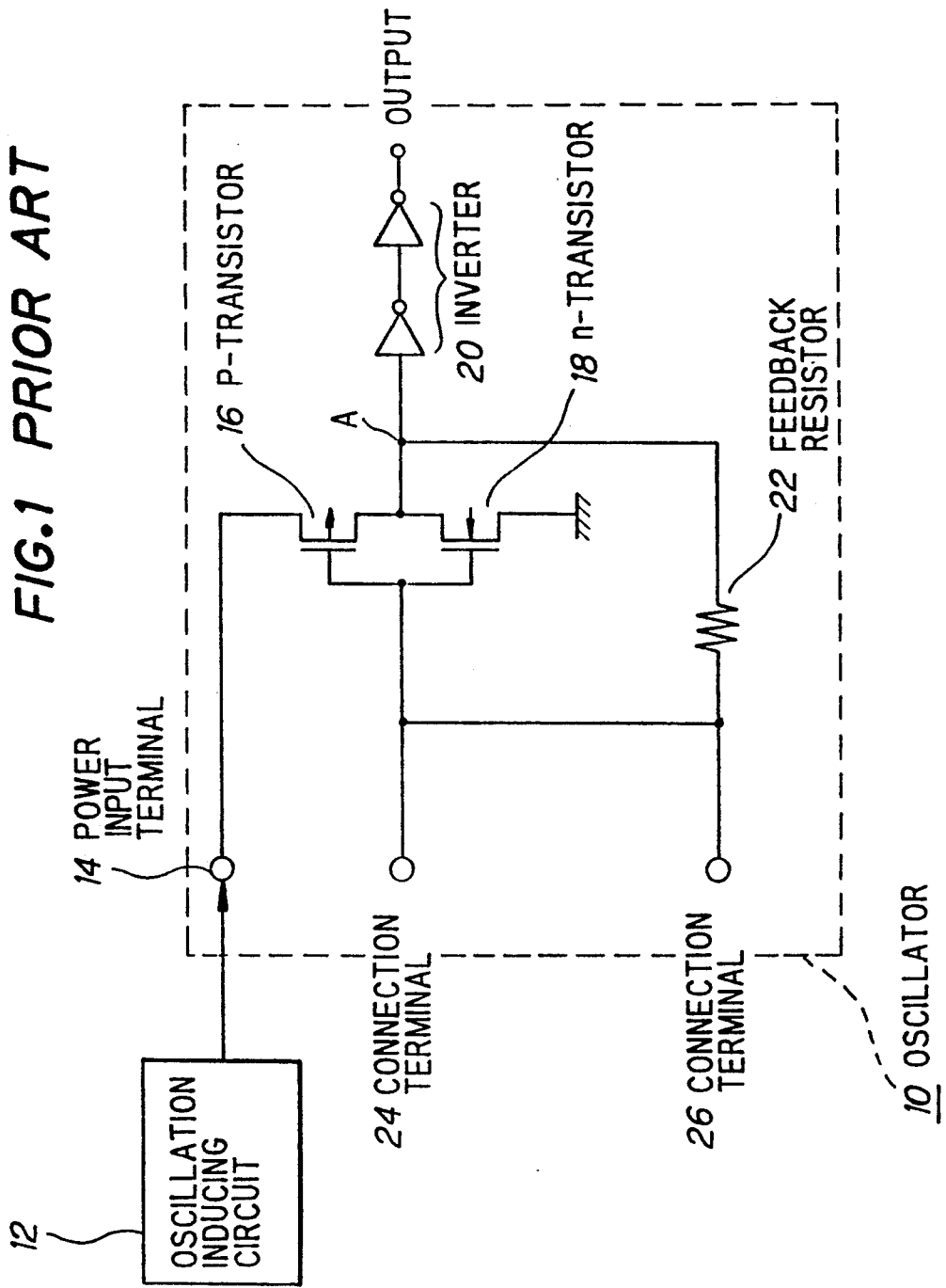
FIG. 1 is a circuit diagram showing a conventional oscillator.

FIG. 1 shows an oscillator 10 to which the conventional oscillation inducing circuit 12 is connected. The oscillator 10 includes a power input terminal 14 supplied with a boosted voltage signal from the oscillation inducing circuit 12. Connection terminals 24 and 26 are connected to a resonator (not shown), respectively. A p-transistor 16 is connected at a source to the power input terminal 14. An n-transistor 18 connected at a source to ground. Inverters 20 is connected at an input to a common drain of the p-transistor 16 and the n-transistor 18. A feedback resistor 22 is connected at an input to a node "A" and at an output to the connection terminals 24 and 26. The common gate of the p-transistor 16 and the n-transistor 18 is connected to the connection terminals 24 and 26.

In operation, an input signal is supplied from resonator through the terminals 24 and 26 to the gates of the P and N transistors 16 and 18. The input signal is inverted in polarity to be amplified in accordance with a voltage applied across the source-drain path of the P and N transistors 16 and 18 and ground by the oscillation inducing circuit 12. The amplified signal is fed back repeatedly through the resistor 22 to the gates of the P and N transistors 16 and 18. Thus, oscillation starts in the feedback loop circuit, so that an oscillation signal is supplied through the inverters 20 to the output terminal.

In this oscillator 10, the input voltage applied to the power input terminal 14 is important to sustain the oscillation. Accordingly, an output voltage level of the oscillation inducing circuit 12 is determined in accordance with the following table.

| THRESHOLD VOLTAGE (V) | | START VOLTAGE | HOLD VOLTAGE |
|---|---|---|---|
| p-transistor 16 | n-transistor 18 | (V) | (V) |
| 0.46 | 0.45 | 0.86 | 0.67 |
| 0.78 | 0.46 | 1.55 | 1.13 |
| 0.62 | 0.61 | 1.18 | 0.90 |
| 0.46 | 0.73 | 1.11 | 0.87 |
| 0.77 | 0.74 | 1.45 | 1.07 |

In this table, a start voltage specifies a minimum voltage needed to generate an oscillation, and a hold voltage specifies a minimum voltage needed to keep or sustain the generated oscillation. As shown in the table, the start voltage is higher than the hold voltage by 0.2 to 0.4 V, so that the output voltage of the oscillation inducing circuit 12 is determined on the basis of the start voltage.

Figure 2:
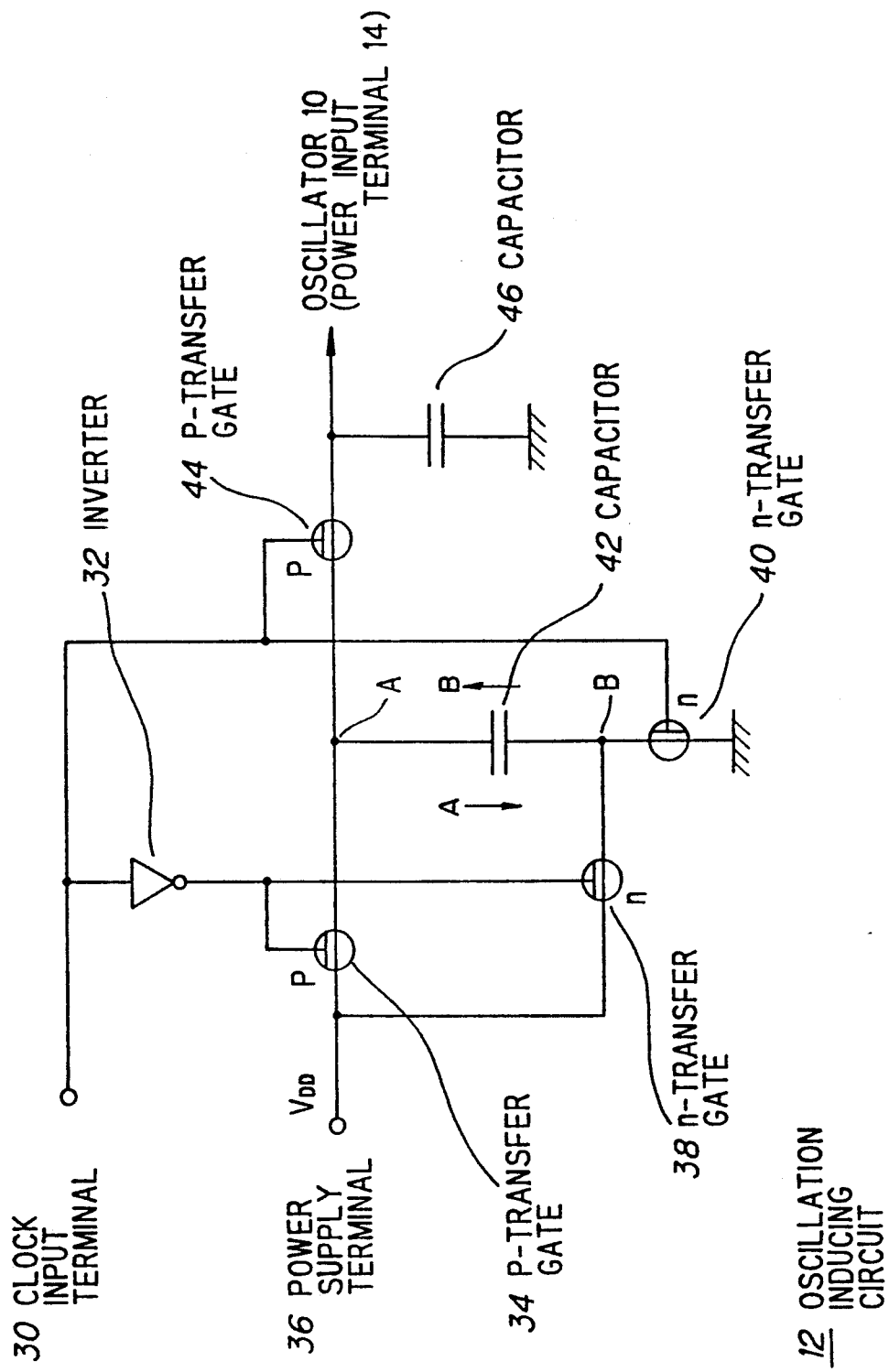
FIG. 2 is a circuit diagram showing a conventional oscillation inducing circuit.

FIG. 2 shows the oscillation inducing circuit 12 which includes a clock input terminal 30 supplied with clock pulse. An inverter 32 is connected at an input to the clock input terminal 30. A p-transistor (defined "p-transfer gate" hereinafter) 34 is connected at a gate to an output of the inverter 32, at a source to a power supply terminal 36 having a voltage level of $V_{DD}$ and at a drain to a node "A". An n-transistor (defined "n-transfer gate" hereinafter) 38 is connected at a gate to the output of the inverter 32, at a source to the power supply terminal 36 and at a drain to a node "B". A n-transfer gate 40 is connected at a gate to the clock input terminal 30, at a source to ground and at a drain to the node "B". A capacitor 42 is connected between the nodes "A" and "B". A p-transfer gate 44 is connected at a gate to the clock input terminal 30 and at a source to the node "A" and at a drain to the power input terminal 14 of the oscillator 10. A capacitor 46 is connected between a drain of the p-transfer gate 44 and ground.

Figure 3:
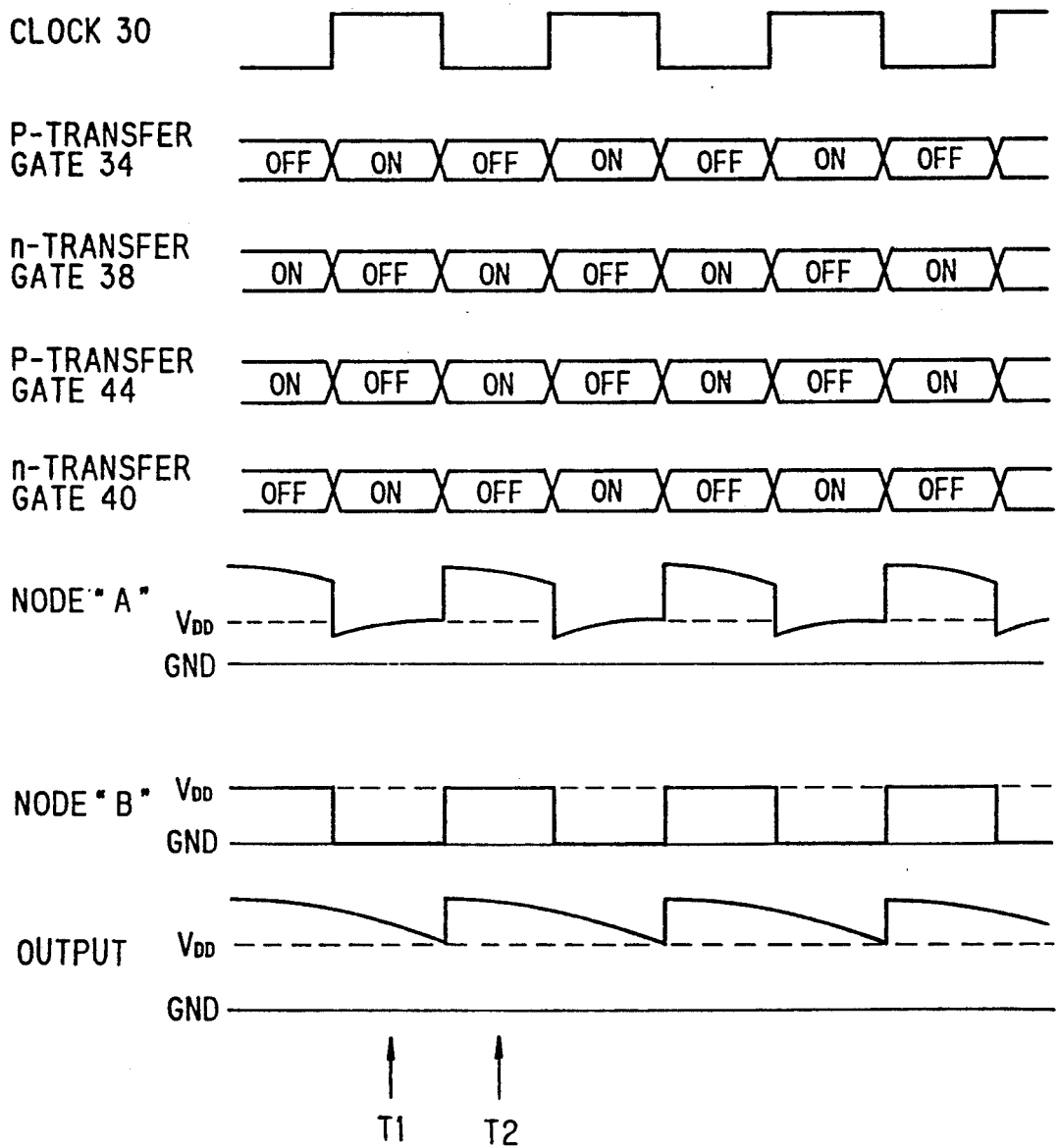
FIG. 3 is a timing chart showing operation of the conventional oscillation inducing circuit.

FIG. 3 is a timing chart showing the operation of the conventional oscillation inducing circuit 12.

In operation, when a high level signal is supplied to the clock input terminal 30 (at a time "T1"), a low level signal is supplied from the inverter 32. Thus, the p-transfer gate 44 is turned off and the n-transfer gate 40 is turned on. At the same time, the p-transfer gate 34 is turned on and the n-transfer gate 38 is turned off, so that the power supply terminal 36 is connected via the p-transfer gate 34, the capacitor 42 and the n-transfer gate 40 to ground. Therefore, the capacitor 42 is charged to the voltage $V_{DD}$ in a polarity direction as indicated by "A".

Next, when a low level signal is supplied to the clock input terminal 30 (at a time "T2"), a high level signal is supplied from the inverter 32. Thus, the p-transfer gate 44 is turned on and the n-transfer gate 40 is turned off. At the same time, the p-transfer gate 34 is turned off and the n-transfer gate 38 is turned on, so that the power supply terminal 36 is connected via the n-transfer gate 38, the capacitor 42, the p-transfer gate 44 and the capacitor 46 to ground. Therefore, the capacitor 42 is charged in a polarity direction as indicated by "B", so that the previously charged voltage is boosted to be approximately 2 $V_{DD}$ at the node "A", so that the capacitor 46 is charged to a voltage approximately equal to the voltage of the node A. The voltage of the capacitor 46 is gradually decreased to the voltage $V_{DD}$ due to the discharge based on the voltage application to the power input terminal 14 of the oscillator 10.

According to the conventional oscillation inducing circuit 12, however, there is a disadvantage in that a clock generator is necessary, because the circuit 12 operates by using a clock pulse supplied to the clock input terminal 30. As a result, the semiconductor IC has a complicated structure and a high cost.

Next, an oscillation inducing circuits of the preferred embodiments according to the invention will be explained in conjunction with FIGS. 4 to 7.

Figure 4:
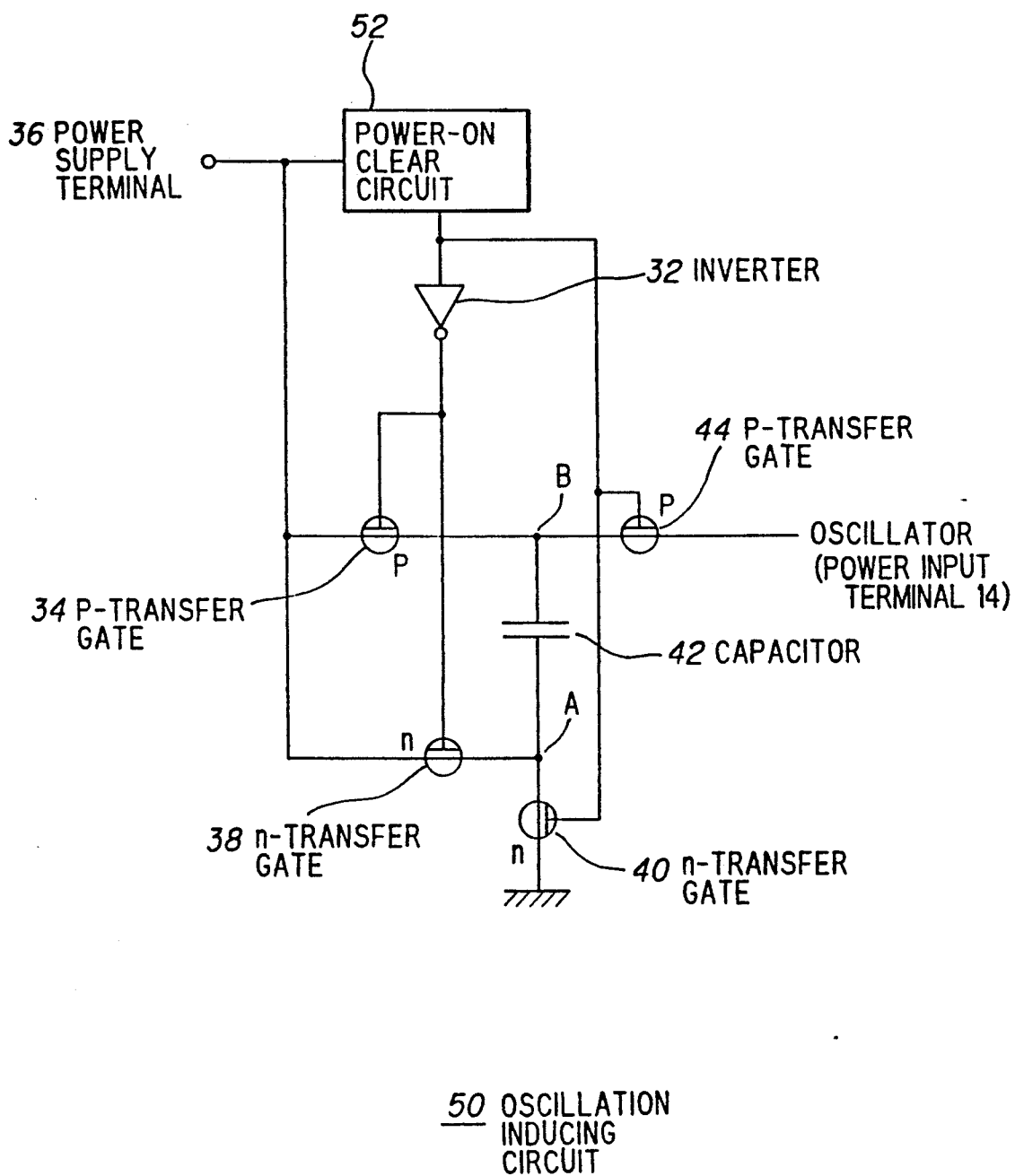
FIG. 4 is a circuit diagram showing an oscillation inducing circuit of a first preferred embodiment according to the invention.

FIG. 4 shows an oscillation inducing circuit 50 of a first preferred embodiment according to the invention. The oscillation inducing circuit 50 includes a power-on clear circuit 52 connected at an input to a power supply terminal 36 having a voltage of $V_{DD}$. A inverter 32 is connected at an input to the power-on clear circuit 52. A p-transfer gate 34 is connected at a gate to an output of the inverter 32, at a source to the power supply terminal 36 and at a drain to a node "B". An n-transfer gate 38 is connected at a gate to the output of the inverter 32, at a source to the power supply terminal 36 and at a drain to a node "A". An n-transfer gate 40 is connected at a gate to the power-on clear circuit 52, at a source to ground and at a drain to the node "A". A capacitor 42 is connected between the nodes "A" and "B". A p-transfer gate 44 is connected at a gate to the power-on clear circuit 52 and at a source to the node "B" and at a drain to an input of the oscillator 10.

Figure 5:
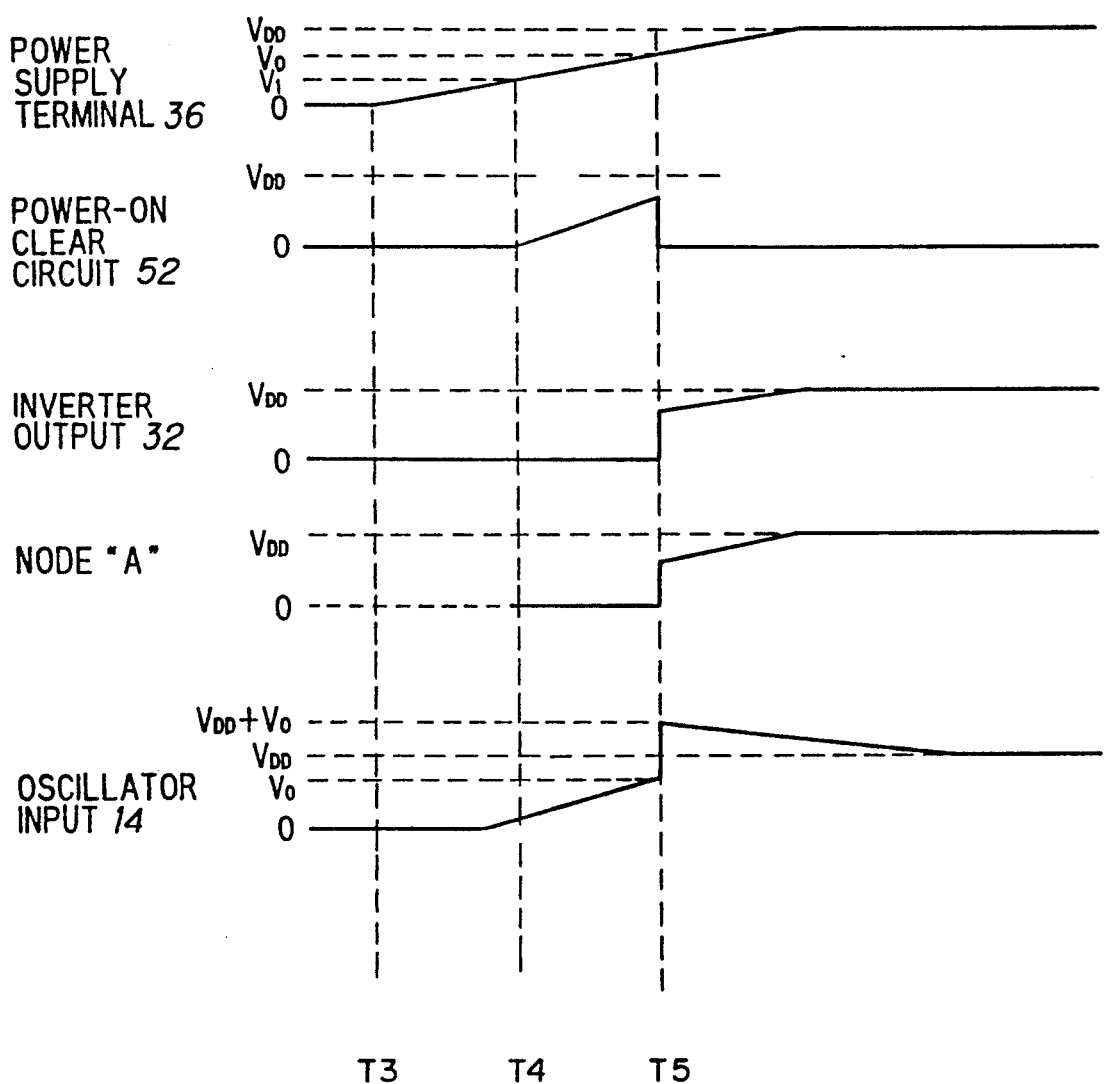
FIG. 5 is a timing chart showing operation of the first preferred embodiment.

FIG. 5 is a timing chart showing the operation of the oscillation inducing circuit 50 of the first preferred embodiment.

In operation, when a power-on switch of the semiconductor IC is turned on (at a time "T3"), a voltage to be supplied from the power supply terminal 36 to the power-on clear circuit 52 increases. Then, when the voltage becomes $V_1$ (at a time "T4"), a high level signal is supplied from the power-on clear circuit 52 before the voltage level at the power supply terminal 36 is heightened to a level $V_0$ by which the operation of the semiconductor IC becomes stable. In response to the high level signal from the power-on clear circuit 52, a low level signal is supplied from the inverter 32, so that the p-transfer gate 34 and the n-transfer gate 40 are turned on and the p-transfer gate 44 and the n-transfer gate 38 are turned off. Therefore, the power supply terminal 36 is connected via the p-transfer gate 34, the capacitor 42 and the n-transfer gate 40 to ground. As a result, the capacitor 42 is charged in a direction of "B" to "A" to the voltage $V_0$.

After that, when the voltage level at the power supply terminal 36 is raised to the level $V_0$, the output level of the power-on clear circuit 52 changes high to low (at a time "T5"). At this time, the p-transfer gate 34 and the n-transfer gate 40 are turned off and the p-transfer gate 44 and the n-transfer gate 38 are turned on. Therefore, the power supply terminal 36 is connected via the n-transfer gate 38, the capacitor 42 and the p-transfer gate 44 to the oscillator 10. As a result, the capacitor 42 is charged in a direction "A" to "B", so that an output signal of a level of $V_{CC} + V_0$ is supplied to the oscillator 10 (power input terminal 14).

As described above, according to the first preferred embodiment, an input voltage having a level $V_{CC} + V_0$ can be applied to the power input terminal 14 of the oscillator 10 at a starting period by using the power-on clear circuit 52. Therefore, clock signals are not necessary to be used, so that the semiconductor IC using the oscillator 10 is simple in structure and is low in cost.

Figure 6:
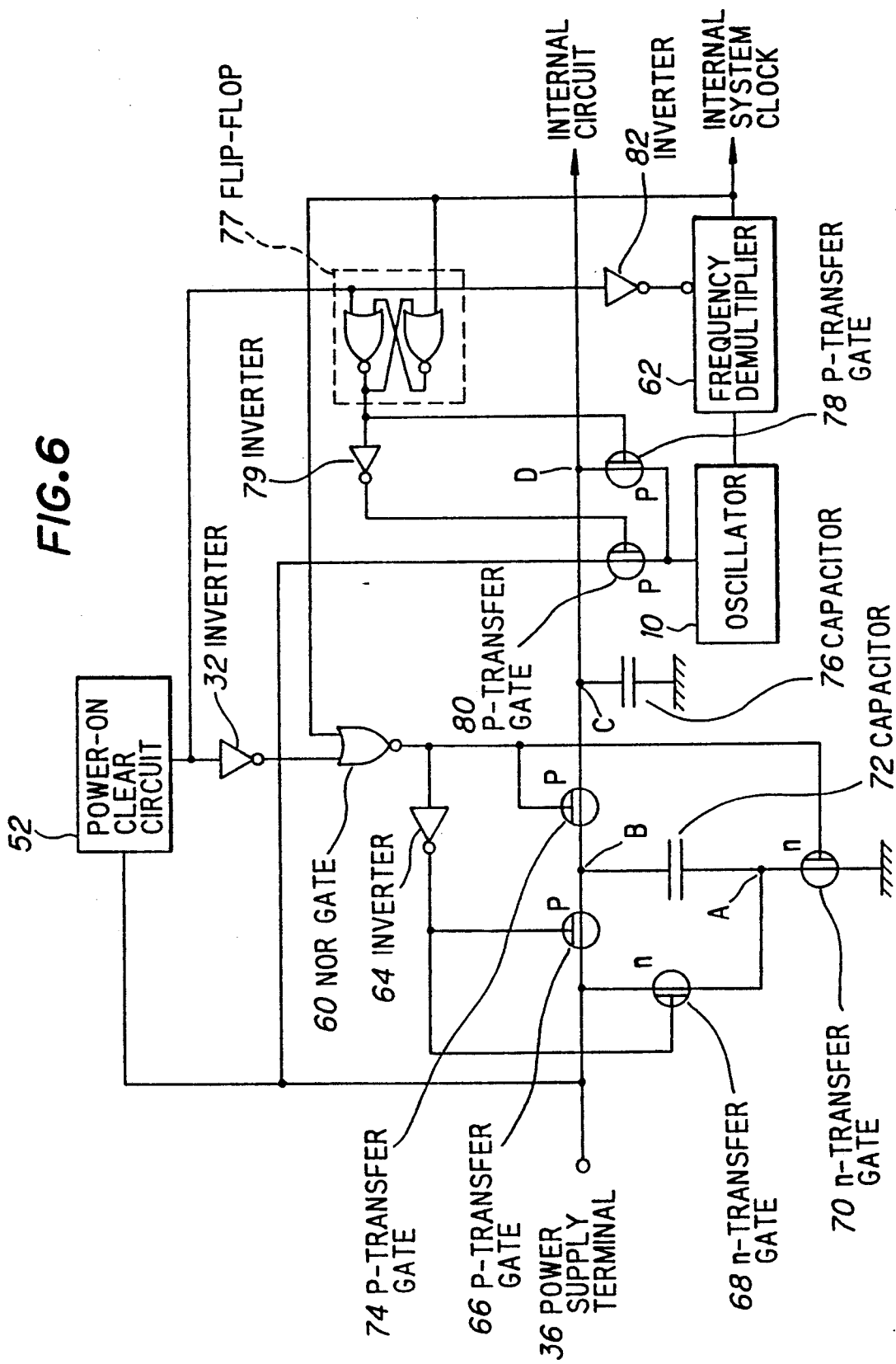
FIG. 6 is a circuit diagram showing an oscillation inducing circuit of a second preferred embodiment according to the invention.

FIG. 6 shows an oscillation inducing circuit of a second preferred embodiment according to the invention. The oscillation inducing circuit is used for a semiconductor IC having an internal circuit operating by a voltage higher than a voltage $V_{DD}$, and includes a power-on clear circuit 52 connected at an input to a power supply terminal 36 having a voltage level of $V_{DD}$. An inverter 32 is connected at an input to the power-on clear circuit 52. A NOR gate 60 is supplied with an output of the inverter 32 and an output of a frequency demultiplier 62. An inverter 64 is connected at an input to an output of the NOR gate 62. A p-transfer gate 66 is connected at a gate to an output of the inverter 64, at a source to the power supply terminal 36 and at a drain to a node "B". An n-transfer gate 68 is connected at a gate to the output of the inverter 64, at a source to the power supply terminal 36 and at a drain to a node "A". An n-transfer gate 70 is connected at a gate to the output of the NOR gate 60, at a source to ground and at a drain to the node "A". A capacitor 72 is connected between the nodes "A" and "B". A p-transfer gate 74 connected at a gate to the output of the NOR gate 60, at a source to the node "B" and at a drain to a node "C". A capacitor 76 is connected between the node "C" and ground. A flip-flop 77 is supplied with the output of the power-on clear circuit 52 and an output of the frequency demultiplier 62. A p-transfer gate 78 is connected at a gate to an output of the flip-flop 77, at a source to a node "D" and at a drain to the oscillator 10. An inverter 79 is supplied with the output of the flip-flop 77. A p-transfer gate 80 is connected at a source to the power supply terminal 36, at a gate to an output of the inverter 79. An inverter 82 is connected at an input to the output of the power-on clear circuit 52 and at output to a reset terminal of the frequency demultiplier 62.

In the oscillation inducing circuit, the node "D" is connected to the internal circuit (not shown), and an output of the frequency demultiplier 62 is connected to an internal system clock terminal (not shown).

FIG. 7 is a timing chart showing operation of the oscillation inducing circuit of the second preferred embodiment.

In operation, when a power-on switch of the semiconductor IC is turned on, a gradually increasing voltage is supplied from the power supply terminal 36 to the power-on clear circuit 52 (at a time "T6"). Then, a high level signal is supplied from the power-on clear circuit 52 before the level at the power supply terminal 36 is raised to a level $V_0$ by which operation of the semiconductor IC becomes stable.

At this time, a low level signal is supplied to the reset terminal of the frequency demultiplier 62 via the inverter 82, so that a low level signal is supplied from the frequency demultiplier 62 to one of the inputs of the NOR gate 60. Then, low level signals are supplied to both of the inputs of the NOR gate 60, so that a high level signal is supplied from the NOR gate 60.

On the other hand, in response to the high level signal from the power-on clear circuit 52, the flip-flop 77 is initialized, so that a low level signal is supplied therefrom. At this time, the p-transfer gates 66 and 78 and the n-transfer gate 70 are turned on, and the p-transfer gates 74 and 80 and the n-transfer gate 68 are turned off. Therefore, the capacitor 72 is charged to a voltage $V_0$. Then, the power supply terminal 36 and the oscillator 10 are not connected by the p-transfer gate 74 in the off state, so that a ground level voltage is applied to the oscillator 10.

After that, when the voltage level at the power supply terminal 36 is raised to the level $V_0$, the output level of the power-on clear circuit 52 changes from high to low (at a time "T7"). In response to the low level signal from the power-on clear circuit 52, a low level signal is supplied from the NOR gate 60. At this time, the p-transfer gate 74 and the n-transfer gate 68 are turned on, and the p-transfer gate 66 and the n-transfer gate 70 are turned off. Thus, the power supply terminal 36 and the oscillator 10 are connected via the n-transfer gate 68, the capacitor 72 and the p-transfer gates 74 and 78. Therefore, a voltage of $V_{CC}+V_0$ is applied to the oscillator 10, and an oscillation occurs therein.

During a period in which the oscillator 10 operates (around a time "T8"), the boosted voltage is also supplied to the internal circuit by controlling the transfer gates 66, 68, 70 and 72 in using the output of the frequency demultiplier 62 as a clock signal.

Next, when a high level signal is supplied from the flip-flop 77 in accordance with the output of the frequency demultiplier 62, the p-transfer gate 78 is turned off and the p-transfer gate 80 is turned on. Therefore, the power supply terminal 36 and the oscillator 10 are connected via only the p-transfer gate 80. As a result, a voltage of $V_{CC}$ is applied to the oscillator 10.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. An oscillation inducing circuit, comprising:
   a power-on circuit for generating a voltage for initializing an integrated circuit by receiving and increasing a voltage of a power supply which is turned on;
   a capacitor having first and second electrodes, said capacitor being charged from said power supply to be a predetermined voltage which is higher than a voltage of said power supply;
   a plurality of transfer gates which are switched on and off in response to a signal from said power-on circuit;
   wherein said capacitor is charged to a voltage equal to said voltage of said power supply in a direction of said first to second electrodes in accordance with a first state of a switching on and off of said transfer gates under the control of said power supply; and
   said capacitor being further charged to said predetermined voltage in a direction of said second to first electrodes in accordance with a second state of switching on and off of said transfer gates by said power supply.

2. An oscillation inducing circuit, according to claim 1, wherein:
   said transfer gates comprises first to fourth transfer gates;
   said first transfer gate being positioned between said power supply and said first electrode of said capacitor, and switched on by an inverted signal of an inverted signal of an output signal of said power-on circuit; said second transfer gate being positioned between said second electrode of said capacitor and ground, and switched on by said output signal of said power-on circuit; said third transfer gate being positioned between said power supply and said second electrode of said capacitor, and switched on by said inverted signal of said output signal of said power-on circuit; and said fourth transfer gate being positioned between said first electrode of said capacitor and an output terminal of said predetermined voltage, and switched on by said output signal of said power-on circuit.

3. An oscillation inducing circuit, according to claim 1, wherein:
   said power-on circuit changes a state of said output signal, when said voltage of said power supply reaches a voltage which stabilizes an operation of said integrated circuit; and said capacitor is charged to said predetermined voltage which is obtained by adding said stabilizing voltage to said voltage of said power supply.

4. An oscillation inducing circuit, comprising:
a power-on circuit for initializing an integrated circuit by turning a power supply on;
a capacitor having first and second electrodes, said capacitor being charged from said power supply to a predetermined voltage which is higher than a voltage of said power supply;
a plurality of transfer gates to be switched on and off dependent on a signal from said power-on circuit;
wherein said capacitor is charged to a voltage, which is equal to said voltage of said power supply in a direction of said first to second electrodes in accordance with a first state of a switching on and off of said transfer gates under the control of said power supply;
said capacitor being further charged to said predetermined voltage in a direction of said second to first electrodes in accordance with a second state of switching on and off of said transfer gates by said power supply;
an oscillator means which starts an oscillation operation in response to receiving said predetermined voltage from said capacitor; and
means for dividing an oscillation frequency produced by said oscillator to provide a divided signal;
wherein said switching on and off of said transfer gates are controlled in response to said signal from said power-on circuit and said divided signal from said dividing means.

* * * * *